United States Patent
Fujishima et al.

[11] Patent Number: 5,885,878
[45] Date of Patent: Mar. 23, 1999

[54] LATERAL TRENCH MISFET AND METHOD OF MANUFACTURING THE SAME

[75] Inventors: Naoto Fujishima; Akio Kitamura, both of Nagano, Japan

[73] Assignee: Fuji Electric Co., Ltd., Japan

[21] Appl. No.: 829,751

[22] Filed: Mar. 31, 1997

Related U.S. Application Data

[62] Division of Ser. No. 547,910, Oct. 25, 1995, Pat. No. 5,701,026.

[30] Foreign Application Priority Data

Oct. 25, 1994 [JP] Japan .................................. 6-258617
Aug. 23, 1995 [JP] Japan .................................. 7-071741

[51] Int. Cl.$^6$ .............................................. H01L 21/8234
[52] U.S. Cl. ...................... 438/302; 438/306; 438/307; 438/297; 148/DIG. 151; 148/DIG. 126
[58] Field of Search .................................... 438/302, 303, 438/304, 306, 307, 176, 192, 221, 225, 229, 230, 236, 296, 297, 298; 257/335, 336, 341, 342, 343, 344

[56] References Cited

U.S. PATENT DOCUMENTS

| | | | |
|---|---|---|---|
| 5,272,098 | 12/1993 | Smayling et al. ...................... | 438/268 |
| 5,434,435 | 7/1995 | Baliga ..................................... | 257/141 |
| 5,539,238 | 7/1996 | Malhi ..................................... | 257/510 |
| 5,701,026 | 12/1997 | Fujishima et al. ..................... | 257/510 |

OTHER PUBLICATIONS

Sakai et al., Technical Report, Japanese Institute of Electrical Engineers, 1992.

*Primary Examiner*—John F. Niebling
*Assistant Examiner*—John Murphy
*Attorney, Agent, or Firm*—Rossi & Associates

[57] ABSTRACT

To provide a lateral MISFET that has a uniform and reliable gate insulation film, and exhibits low on-resistance and excellent balance between the breakdown voltage and on-resistance. The device of the invention has an n-type semiconductor substrate, in a part of the surface layer thereof is formed a trench. An n-drain region is formed in the bottom of the trench. A side wall oxide film is formed on the side face of the trench. The trench is filled with a conductive material, on which is formed a drain electrode. A p-base region and an n-source region are self-aligned on the portion of the substrate in which the trench is not formed. A MIS gate is disposed on the p-base region. Since the portion of the substrate along the side wall oxide film functions as a drain drift region, the unit cell dimension are greatly reduced, the on-resistance is reduced, and therefore the trade-off relation between the breakdown voltage and the on-resistance is improved.

2 Claims, 9 Drawing Sheets

LATERAL TRENCH MISFET AND METHOD OF MANUFACTURING THE SAME

This is a Division of application Ser. No. 08/547,910, filed Oct. 25, 1995 U.S. Pat. No. 5,701,026.

BACKGROUND OF THE PRESENT INVENTION

The present invention relates to lateral MISFETs (metal-insulator-semiconductor field effect transistors) having a trench structure, and a method of manufacturing the lateral MISFETs. The lateral MISFET, that exhibits a high breakdown voltage and a low on-resistance, is used as an individual device or integrated into a power IC incorporated into an electronic instrument, an IC for driving a motor, an IC for driving a liquid crystal display, etc.

A power MOSFET (metal-oxide-semiconductor field effect transistor), one of the MISFETs, is outstanding by virtue of its low loss and high switching speed among the power semiconductor devices. However, the power MOSFET has a problem in reducing its on-resistance. Since the power MOSFET is a single-carrier (electron or hole) device, the conductivity thereof is not modulated by minority carrier injection. On the other hand, techniques for forming trenches in a semiconductor surface are adopted in various ways inclusive of aiming at on-resistance reduction in the semiconductor devices. And, various semiconductor devices which have a trench structure therein have been proposed recently.

Figure 13:
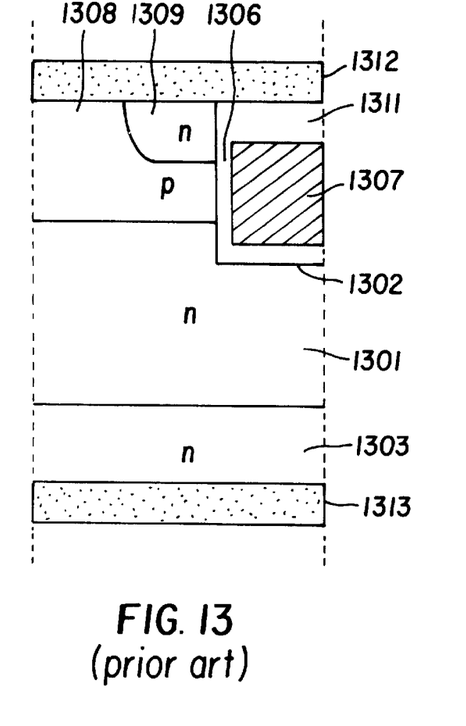
FIG. 13 is a cross section of a conventional vertical trench MOSFET.

FIG. 13 is a cross section of a part of a vertical trench MOSFET. FIG. 13 shows a unit cell of the MOSFET that includes a half of a trench. Many actual MOSFETs adopt a structure that connects in parallel many such unit cells arranged alternately in a mirror symmetry. The actual MOSFET requires a peripheral portion that sustains the breakdown voltage thereof in addition to the current carrying portion shown in FIG. 13. Since the general structures may be adopted to the peripheral portion, explanation of the peripheral portion will be omitted. In FIG. 13, a trench 1302 is formed from a first major surface of a semiconductor substrate 1301. A p-base region 1308 is formed beside the trench 1302. An n-source region 1309 is formed in a part of the surface layer of the base region 1308. An n-drain layer 1303 is formed on a second major surface of the semiconductor substrate 1301. The side face of the trench 1302 is covered with a thin gate oxide film 1306. A gate electrode 1307 is buried in the trench 1302. A source electrode 1312 that contacts commonly with the n-source region 1309 and the p-base region 1308 is disposed on the first major surface, from that the trench 1302 is formed, of the semiconductor substrate 1301. A drain electrode 1313 is disposed on the back surface of the n-drain layer 1303. As shown in the figure, the source electrode 1312 may be extended over the gate electrode 1307 with an inter-layer insulation film 1311 inserted inbetween. When a positive voltage is applied to the gate electrode 1307 of the device of FIG. 13, a channel inverted to n-type is created in the surface layer of the p-base region 1308 beneath the gate electrode 1307, and the n-source region 1309 and the n-drain region 1303 are electrically connected with one another.

The vertical trench MOSFET of FIG. 13 facilitates reducing the cell pitch, i.e. the dimensions of the unit cell, since the MOS gate structure thereof is disposed in the trench. Therefore, the vertical trench MOSFET of the figure facilitates reducing the on-resistance thereof by arranging more unit cells in a unit area. However, since the drain electrode 1313 is disposed on the back surface of the semiconductor substrate 1301, the MOSFET of FIG. 13 has drawbacks in integration with the control and protection circuits into a monolithic structure, in integration of a plurality of the MOSFETs into a single chip, and in adoption of a multi-drain structure.

In contrast to the vertical MOSFETs, lateral MOSFETs in which the source and drain electrodes are disposed on the same side of the semiconductor substrate facilitate integration with the control and protection circuits into a monolithic structure, integration of a plurality of the MOSFETs into a single chip, and adoption of a multi-drain structure. As far as the present inventors know, two lateral MOSFETs which have a trench structure have been reported so far. The first example is a top-drain-trench type RESURF DMOS transistor construction disclosed in the Japanese Unexamined Laid Open Patent Application (Koukai) No. H06-97450. The top-drain-trench type RESURF DMOS has a trench, on the first side thereof is formed a p-base region. An n-source region is formed in a part of the surface layer of the p-base region. The first side of the trench on which the n-source region is formed is covered with a thin gate oxide film. A gate electrode is buried in the trench. An n-drain drift region is formed on the second side of the trench opposed to the first side. The second side of the trench is covered with a thick oxide film. On the semiconductor layer located on the side opposed across the trench to the side on which the n-source region is formed, an n-drain region is formed in contact with the n-drain drift region. Thus, the top-drain-trench type RESURF DMOS increases integrated unit cells to reduce the on-resistance thereof by forming the MOS gate on the side face of the trench.

Figure 14:
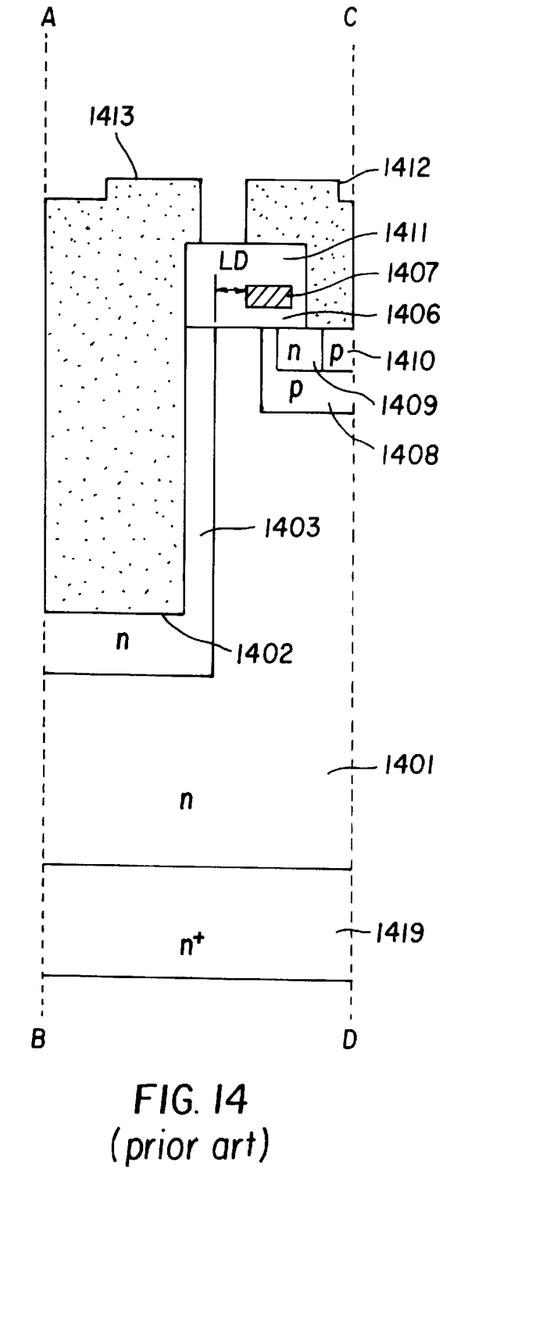
FIG. 14 is a cross section of a conventional lateral trench MOSFET.
Figure 15A:
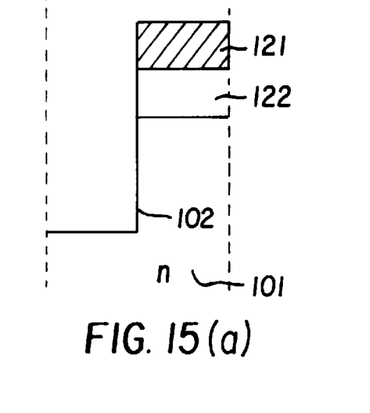
FIGS. 15 shows cross sections of a part of the device of FIG. 1 for explaining the process for manufacture thereof.
Figure 15B:
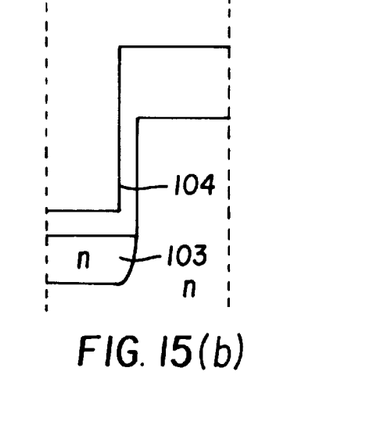
Figure 15C:
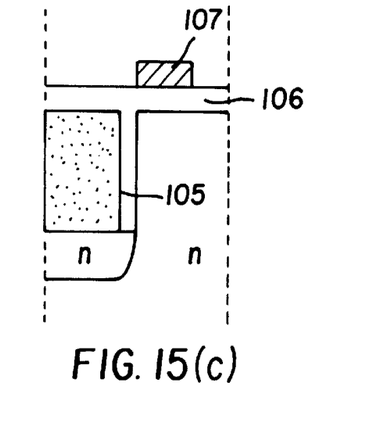

The second example of the lateral trench MOSFET is a TDD (trench-drain-double diffusion) MOSFET structure (cf. Sakai et al., Technical Report, EDD-92–92, Japanese Institute of Electrical Engineers). FIG. 14 is a cross section of the TDD MOSFET. Referring now to FIG. 14, an epitaxial substrate has an n+ substrate 1419 on which is laminated an n-type semiconductor layer 1401. A p-base region 1408 and an n-source region 1409 are self-aligned by double diffusion in the surface layer of the epitaxial substrate. A p-contact region 1410, with a higher impurity dose than the p-base region 1408, is formed in the surface layer portion of the p-base region 1408 in which the n-source region 1409 is not formed. A poly-crystalline silicon gate electrode 1407 is disposed above the portion of the p-base region 1408, with a gate oxide film 1406 inserted inbetween, extending between the n-type semiconductor layer 1401 and the n-source region 1409. A source electrode 1412 is disposed in common contact with the n-source region 1409 and the p-contact region 1410. A trench 1402 is dug in a drain region. After forming an n-drain region 1403 by diffusion from the inside wall of the trench 1402, a drain electrode 1413 is disposed on the bottom and side faces of the trench 1402. The side and upper parts of the gate electrode 1407 is covered with an inter-layer insulation film 1411 to insulate the gate electrode 1407 from the source electrode 1412. By applying a positive bias voltage to the gate electrode 1407, a channel is created in the surface layer of the p-base region 1408, and the n-drain region 1403 and the n-source region 1409 are electrically connected with one another. The TDD MOSFET of FIG. 14 increases the contact area and reduces the contact resistance of the drain electrode 1413 by forming the trench 1402 in the drain region. By these means, the TDD MOSFET has reduced the on-resistance thereof by 5%.

In the first device structure of the conventional lateral trench MOSFETs, it is hard to secure the uniformity and reliability of the gate oxide film because of the etching damage at trench formation and the stress exerted to the corner of the trench at oxidizing to form the gate oxide film. Moreover, since two kinds of gate oxide films should be formed on the right and left halves of the trench respectively, the process for manufacture is inevitably complicated. The second example of the conventional lateral trench MOS-FETs avoids the problems pointed out above, since the gate of the MOS structure is formed in a portion in which the trench is not formed. However, since the breakdown voltage of the device is determined by the distance LD of FIG. 14 between the gate and drain, the adoption of the trench structure is not expected to contribute to integrated unit cell increase.

SUMMARY OF THE INVENTION

In viewing the forgoing, it is an object of the present invention to provide a lateral trench MISFET that exhibits excellent uniformity and reliability of the gate oxide film, reduces the on-resistance by increasing the integrated unit cells without sacrificing the breakdown voltage, and facilitates integration with the control and protection circuits into a monolithic structure, integration of a plurality of the MOSFETs into a single chip and adoption of a multi-drain structure. It is another object of the present invention to provide a method of manufacturing such a lateral trench MISFET.

According to an aspect of the invention, there is provided a lateral trench MISFET that comprises: a semiconductor layer of a first conductivity type; a trench formed in the surface layer of the semiconductor layer; a drain region of the first conductivity type formed in the bottom of the trench; a side wall insulation film formed on the side face of the trench; a base region of a second conductivity type formed on the portion, therein the trench is not formed, of the semiconductor layer; a source region of the first conductivity type formed in a part of the surface layer of the base region; a gate electrode fixed to the portion of the base region extending between the semiconductor layer and the source region through a gate insulation film; a source electrode fixed in common to the source region and the base region; and a conductive material disposed in the trench.

By the structure described above, a lateral MISFET is obtained that uses the semiconductor layer of the first conductivity type extending between the base region of the second conductivity type and the drain region of the first conductivity type as a vertical drain drift region.

According to another aspect of the invention, there is provided a lateral trench MISFET that comprises:

a semiconductor layer of a first conductivity type; a trench formed in the surface layer of the semiconductor layer; a drain region of the first conductivity type formed in the bottom of the trench; a side wall insulation film formed on the side face of the trench; a well region of the first conductivity type formed in a part of the surface layer of the portion, therein the trench is not formed, of the semiconductor layer, the well region being more heavily doped than the semiconductor layer; a base region of a second conductivity type formed in a part of the surface layer of the well region; a source region of the first conductivity type formed in the surface layer of the base region; a gate electrode fixed to the portion of the base region extending between the well region and the source region through a gate insulation film; a source electrode fixed in common to the source region and the base region; and a conductive material disposed in the trench.

By the structure described above, narrowing of the current path, caused by the junction type FET effect when the device is turned on, is prevented.

It is preferable to provide the lateral trench MISFET with a side wall region of the second conductivity type formed in the semiconductor layer along the side wall insulation film of the trench.

By adjoining the drain drift region of the first conductivity type and the side wall region of the second conductivity type, the specific resistivity of the semiconductor layer may be lowered, since depletion of the both regions is promoted and a high breakdown voltage is maintained.

It is also preferable to provide the lateral trench MISFET with a semiconductor substrate of the second conductivity type disposed beneath the semiconductor layer.

By adopting this structure, it is facilitated to integrate other control and protection circuits or a plurality of devices into a single chip by using a junction separation structure.

According to still another aspect of the invention, there is provided a lateral trench MISFET that comprises:

a semiconductor layer of a first conductivity type; a trench formed in the surface layer of the semiconductor layer; a drain drift region of a second conductivity type formed in the portion of the semiconductor layer facing to the trench; a drain region of the second conductivity type formed in the bottom of the trench, the drain region being more heavily doped than the drain drift region; a side wall insulation film formed on the side face of the trench; a base region of the first conductivity type formed on the portion, therein the trench is not formed, of the semiconductor layer; a source region of the second conductivity type formed in a part of the surface layer of the base region; a gate electrode fixed to the portion of the base region extending between the drain drift region and the source region through a gate insulation film; a source electrode fixed in common to the source region and the base region; and a conductive material disposed in the trench.

This structure facilitates reducing the specific resistivity of the drain drift region of the second conductivity type, since depletion of the adjoining drain drift region and semiconductor layer is promoted and a high breakdown voltage is maintained.

It is preferable to provide the lateral trench MISFET with a side wall region of the first conductivity type formed in the drain drift region along the side wall insulation film.

By the sandwich structure that sandwiches the drain drift region between the side wall region and the semiconductor layer, the specific resistivity of the drain drift region may be further reduced, since depletion of the both regions is promoted and a high breakdown voltage is maintained.

It is also preferable to extend the gate electrode to the extension of the outer side of the trench.

The extended gate electrode equalizes the potential distribution by the field plate effect thereof.

According to still another aspect of the invention, there is provided a lateral trench MISFET that comprises:

a semiconductor layer of a first conductivity type; a trench formed in the surface layer of the semiconductor layer; a drain region of the first conductivity type formed in the bottom of the trench; a side wall insulation film formed on the side face of the trench; a base region of a second conductivity type formed at least in a part of the surface layer of the portion, therein the trench is not formed, of the semiconductor layer; a source region of the first conductivity type formed in a part of the surface layer of the base region; a gate electrode disposed opposed facing through a gate insulation film to the exposed portion of the base region extending between the semiconductor layer and the source region, the exposed portion being exposed to the trench; a source electrode fixed in common to the source region and the base region; and a conductive material disposed in the trench.

By the structure described above, a lateral MISFET obtained that buries the gate electrode in the trench and that uses the semiconductor layer of the first conductivity type extending between the base region of the second conductivity type and the drain region of the first conductivity type as a vertical drain drift region.

According to still another aspect of the invention, there is provided a lateral trench MISFET that comprises:

a semiconductor layer of a first conductivity type; a trench formed in the surface layer of the semiconductor layer; a drain region of the first conductivity type formed in the bottom of the trench; a side wall insulation film formed on the side face of the trench; a well region of the first conductivity type formed at least in a part of the surface layer of the portion, therein the trench is not formed, of the semiconductor layer, the well region being more heavily doped than the semiconductor layer; a base region of a second conductivity type formed in a part of the surface layer of the well region; a source region of the first conductivity type formed in a part of the surface layer of the base region; a gate electrode disposed opposed facing through a gate insulation film to the exposed portion of the base region extending between the well region and the source region, the exposed portion being exposed to the trench; a source electrode fixed in common to the source region and the base region; and a conductive material disposed in the trench, the conductive material being insulated from the gate electrode.

By the structure described above, narrowing of the current path, caused by the junction type FET effect when the device is turned on, is prevented.

By providing this structure with a semiconductor substrate of the second conductivity type located beneath the semiconductor layer of the first conductivity type, it is facilitated to integrate other control and protection circuits or a plurality of device into a single chip by using a junction separation structure.

According to still another aspect of the invention, there is provided a lateral trench MISFET that comprises:

a semiconductor layer of a first conductivity type; a trench formed in the surface layer of the semiconductor layer; a drain drift region of a second conductivity type formed in the portion of the semiconductor layer facing to the trench; a drain region of the second conductivity type formed in the bottom of the trench, the drain region being more heavily doped than the drain drift region; a side wall insulation film formed on the side face of the trench; a base region of the first conductivity type formed at least in a part of the surface layer of the portion, therein the trench is not formed, of the semiconductor layer; a source region of the second conductivity type formed in a part of the surface layer of the base region; a gate electrode disposed opposed facing through a gate insulation film to the exposed portion of the base region extending between the drain drift region and the source region, the exposed portion being exposed to the trench; a source electrode fixed in common to the source region and the base region; and a conductive material disposed in the trench, the conductive material being insulated from the gate electrode.

By this structure, the gate electrode is buried in the trench and it is facilitated to reduce the specific resistivity of the drain drift region of the second conductivity type, since depletion of the adjoining drain drift region and semiconductor layer is promoted and a high breakdown voltage is maintained.

It is preferable to provide the lateral trench MISFET with a drain electrode disposed on the conductive material.

By this electrode structure, unevenness of the electrode is avoided and the device structure easy in manufacture thereof is obtained.

According to still another aspect of the invention, there is provided a method of manufacturing the lateral trench MISFET, the method comprising the steps of: forming a trench in the surface layer of a semiconductor layer of a first conductivity type by etching using a mask; forming a drain region of the first conductivity type in the bottom of the trench by ion implantation and by subsequent diffusion; burying a conductive material in the trench; flattening the surfaces of the semiconductor layer and the conductive material so as to expose the surface of the portion, therein the trench is not formed, of the semiconductor layer; forming a gate electrode on an gate insulation film; forming a base region of the second conductivity type and a source region of the first conductivity type by using the gate electrode as a mask for self-alignment; forming an inter-layer insulation film; opening contact holes in the inter-layer insulation film; and disposing a drain electrode and a source electrode through the contact holes.

By the above described manufacturing method, the lateral trench MISFET of the invention that has a drain region of a first conductivity type in the bottom of the trench is obtained easily.

According to still another aspect of the invention, there is provided a method of manufacturing the lateral trench MISFET, the method comprising the steps of: forming a trench in the surface layer of a semiconductor layer of a first conductivity type by etching using a mask; forming a drain region of the first conductivity type in the bottom of the trench by ion implantation and by subsequent diffusion; forming a side wall region of the second conductivity type in the side face of the trench by oblique ion implantation at an oblique angle to the side face and by subsequent diffusion; burying a conductive material in the trench; flattening the surfaces of the semiconductor layer and the conductive material so as to expose the surface of the portion, therein the trench is not formed, of the semiconductor layer; forming a gate electrode on an gate insulation film; forming a base region of the second conductivity type and a source region of the first conductivity type forming an inter-layer insulation film; opening contact holes in the inter-layer insulation film; and disposing a drain electrode and a source electrode through the contact holes.

By the above described manufacturing method, the lateral trench MISFET of the invention, that has a drain region of the first conductivity type in the bottom of the trench and a side wall region of the second conductivity type formed in the semiconductor layer along the side wall of the trench, is obtained easily.

The lateral trench MOSFET of the present invention arranges a drain drift region, an important means that determines the breakdown voltage thereof, vertically between base and drain regions by forming the drain region in the bottom of a trench and by forming the base and source regions on the portion in which the trench is not formed. By this structure, a high breakdown voltage is realized in the lateral trench MOSFET, the unit cell area thereof is narrowed. Since the unit cell area is narrow, much more unit cells may be integrated into a single chip to reduce the overall on-resistance.

By disposing a heavily doped well region or increasing the impurity dose of the drain drift region by disposing a side wall region of an opposite conductivity type to the conductivity type of the drain drift region, the on-resistance is further reduced.

DETAILED DESCRIPTION OF THE PREFERRED EMBODIMENTS

Hereinafter, the present invention will be described in detail with reference to the accompanied drawings which illustrate the preferred embodiments of the invention. Though the present invention will be explained by way of examples exhibiting a breakdown voltage of 100 V, the present invention is applicable to power MOSFETs exhibiting a breakdown voltage of 30 to 600 V and an output current of 1 to 100 A.

Figure 1:
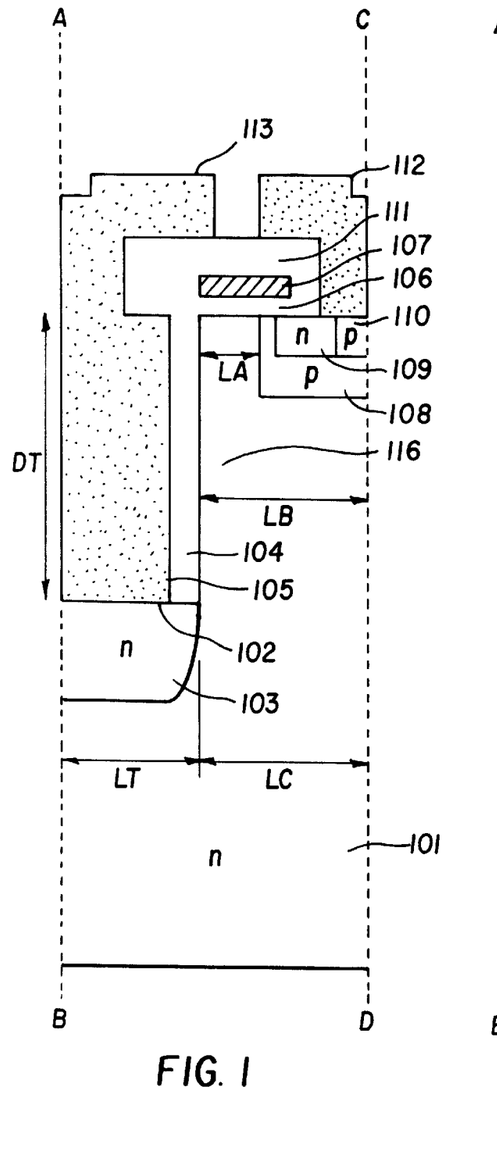
FIG. 1 is a cross section of a first embodiment of a lateral trench MOSFET according to the present invention.

FIG. 1 is a cross section of a first embodiment of a lateral trench MOSFET according to the present invention. FIG. 1 shows a unit cell that includes a half trench. In actual devices, the illustrated unit cell structure is repeatedly arranged in mirror symmetry with respect to the lines A–B and C–D, and many unit cells are connected in parallel. The region designated by the symbol n or p indicates that the electron or hole, respectively, is the majority carrier in that area.

Referring now to FIG. 1, a trench 102 is dug in the surface layer of the n-type semiconductor substrate 101 with specific resistivity of 5 Ω·cm. An n-drain region 103 is formed in the bottom of the trench 102. The trench 102 is 2 μm in width (2×LT of the figure) and 3 μm in depth (DT). The surface concentration of the n-drain region 103 is $1\times10^{20}$ cm$^{-3}$ and its diffusion depth is 1 to 3 μm. A side wall oxide film 104 of 0.5 to 1 μm in thickness is formed on the side wall of the trench 102. The trench 102 is filled with wolfram silicide 105. A p-base region 108 is formed in a part of the surface layer of the n-type semiconductor substrate 101 with a narrow space from the trench 102. An n-source region 109 is formed in a part of the surface layer of the p-base region 108. A poly-crystalline silicon gate electrode 107 is disposed, with a gate oxide film 106 of 20 to 50 nm in thickness inserted inbetween, above the portions of the p-base region 108 and the n-type semiconductor substrate 101 extending between the n-source region 109 and the trench 102. The p-base region 108 and the n-source region 109 are self-aligned by using the edge of the gate electrode 107 for masking. A p-contact region 110, with a higher impurity dose than the p-base region 108, is formed in a part of the surface layer of the p-base region 108. A source electrode 112 is disposed in common contact with the p-contact region 110 and n-source region 109. A drain electrode 113 is disposed on the wolfram silicide 105. An inter-layer insulation film 111 is formed on the side and upper faces of the gate electrode 107 to insulate the gate electrode 107 from the source electrode 112 and the drain electrode 113. The illustrated unit structure is repeated so as to elongate the boundary between the trench 102 and the region in which the trench is not formed, and the boundary is formed in comb-tooth on a plan view.

FIGS. 15(a)–(c) and 16(a)–(c) show cross sections of a part of the device of FIG. 1 for explaining the process for manufacture. The process for manufacture of the device of FIG. 1 will be explained below.

An oxide film 122 is formed on the n-type semiconductor substrate 101 with specific resistivity of 5 Ω·cm. The oxide film 122 is etched by using as a mask a photoresist film 121 on that a pattern is formed. Anisotropic etching is conducted selectively on the n-type semiconductor substrate 101 by using the photoresist film 121 or the oxide film 122 for masking to form the trench 102 (FIG. 15(a)). The width of about 2 μm and the depth of about 3 μm of the trench 102 are appropriate for realizing the breakdown voltage of the device of 100 V. The trench should be deepened more to realize a higher breakdown voltage. After removing the photoresist film 121, an oxide film of about 0.1 μm in thickness is formed by thermal oxidation on the bottom and side faces of the trench 102. Then, phosphorus ions are implanted. The phosphorus ions are implanted only into the bottom of the trench 102, since the surface of the substrate 101 is covered with the thick oxide film 122 and since the phosphorus ion beam runs almost in parallel to the side wall of the trench 102. The implanted phosphorus ions are diffused by heat treatment to form the n-drain region 103. The surface concentration of the n-drain 103 is $1\times10^{20}$ cm$^{-3}$ and the diffusion depth thereof is 1 to 3 μm. The side wall film 104 of the trench 102 is thickened to 0.5 to 1 μm by the heat treatment or by additional CVD (FIG. 15(b)). Then, after removing the oxide film from the bottom of the trench 102, the wolfram silicide 105 is buried in the trench 102. The surfaces of the wolfram silicide 105 and the semiconductor region are flattened to expose the surface of the semiconductor region in which the trench is not formed. Then, the gate oxide film 106 is formed by thermal oxidation to a thickness of 20 to 50 nm, and the poly-crystalline silicon gate electrode 107 is formed by low pressure CVD and subsequent photo-etching (FIG. 15(c)).

Figure 16A:
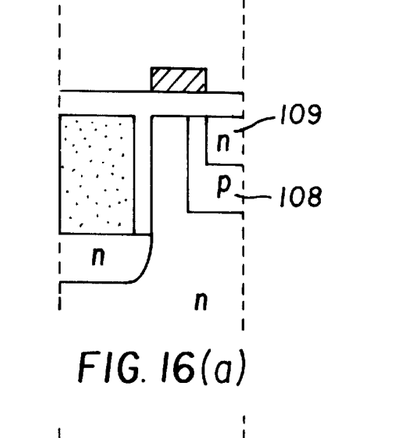
FIGS. 16 show cross sections of a part of the device of FIG. 1 for explaining the process for manufacture subsequent to the process of FIG. 15.
Figure 16B:
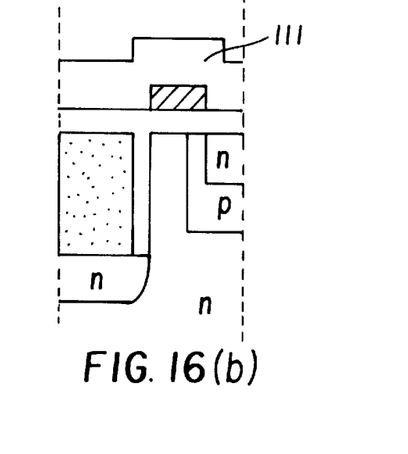
Figure 16C:
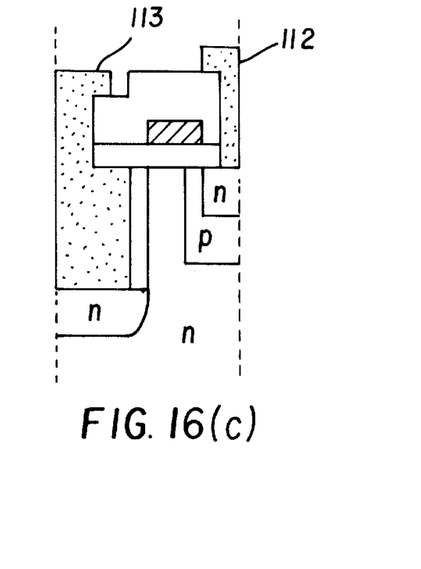

Then, the p-base region 108, the n-source region 109 and the p-contact region not illustrated in FIG. 16 are formed by ion-implantation using the edge of the gate electrode 107 for masking and by subsequent heat treatment (FIG. 16(a)). Then, the inter-layer insulation film 111 is deposited on the side and upper faces of the gate electrode 107 to insulate the gate electrode 107 from the other electrodes (FIG. 16(b)). And, contact holes are opened in the inter-layer insulation film 111 and the oxide film 106, and the source electrode 112 and the drain electrode 113 are formed (FIG. 16(c)). Finally, the passivation film is deposited on the device at the end of the wafer process.

By applying a positive voltage to the gate electrode 107 of the device of FIG. 1, a channel region inverted to n-type is created in the surface layer of the p-base region 108, and electrons flow from the n-source region 109 to the substrate 101 through the inversion layer formed in the surface of the p-base region 108. The electrons flow through the drain drift region 116 of the substrate 101 in parallel to the side wall of the trench 102 as a drift current, reach the n-drain region 103, and flow through the wolfram oxide 105 to the drain electrode 113.

The distance corresponding to the distance LD between the gate electrode 1407 and the n-drain region 1403, i.e. the important parameter that determines the breakdown voltage of the device as mentioned earlier with reference to the conventional second example of FIG. 14, is the length of the drain drift region that is the depth DT of the trench 102. Since the depth DT is secured almost independently of the lateral cell pitch, the depth DT of the trench 102 may be deepened without sacrificing the unit cell integration. The other optimum dimensions in FIG. 1 include 2 $\mu$m for LA and 3.5 $\mu$m for LB.

If we compare the lateral trench MOSFET of the invention with the usual lateral MOSFET at the same breakdown voltage of 100 V, the cell pitch of the usual lateral MOSFET is given by $LT+LC+DT=1+3.5+3=7.5$ $\mu$m, while the cell pitch of the present lateral trench MOSFET is given by $LT+LC=1+3.5=4.5$ $\mu$m.

That is, the unit cells may be integrated by the device structure of the present invention $(7.5/4.5)^2=2.78$ times at the maximum as many as by the usual lateral MOSFETs. And, the corresponding on-resistance reduction is expected to the device structure of the invention. In fact, an experimental device manufactured in the structure of the invention has reduced the on-resistance down to less than a half the on-resistance of the usual lateral MOSFET at the same breakdown voltage.

The device structure shown in FIG. 1 facilitates realizing a device with a high breakdown voltage, since the electric field distribution is equalized by the field plate function of the gate electrode 107 that is extended to the extension of the outside edge of the side wall oxide film 104 as well as to above the p-base region 108. Moreover, by disposing the MIS gate on the portion of the n-type substrate 101 in which the trench 102 is not formed, the uniformity and reliability of the gate oxide film 106 are secured.

Figure 2:
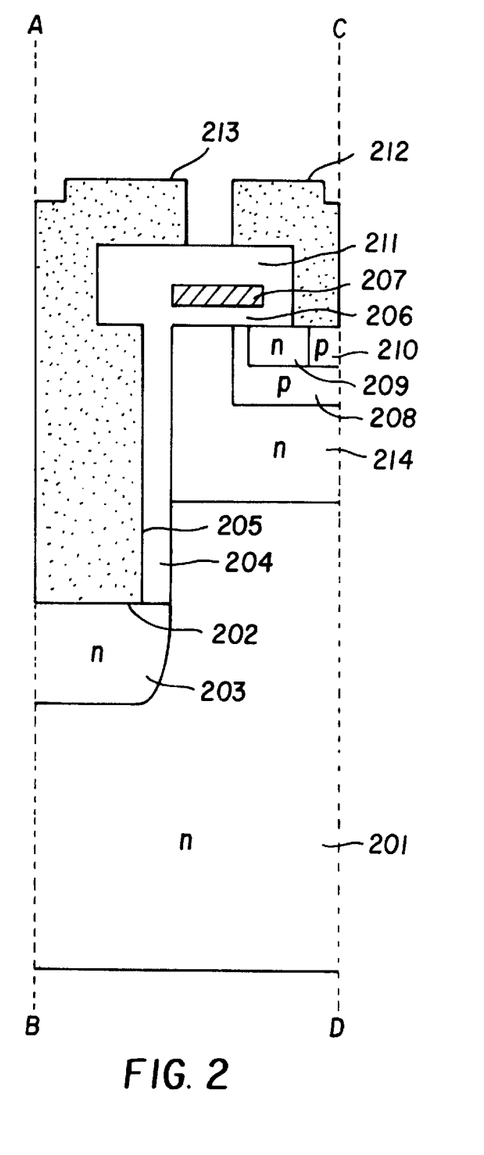
FIG. 2 is a cross section of a second embodiment of a lateral trench MOSFET according to the present invention.

FIG. 2 is a cross section of a second embodiment of a lateral trench MOSFET according to the present invention. The device of FIG. 2 is different from the device of FIG. 1 in that an n-well region 214 is formed in the surface layer of an n-type semiconductor substrate 201 with specific resistivity of 5 $\Omega$·cm by phosphorus ion implantation and subsequent thermal diffusion. The surface concentration of the n-well region 214 is $3\times10^{16}$ cm$^{-3}$, and the diffusion depth of the n-well region 214 is 2 $\mu$m. A trench 202 is dug in the surface layer of the n-type semiconductor substrate 201. An n-drain region 203 is formed in the bottom of the trench 202. A side wall oxide film 204 of 0.5 to 1 $\mu$m in thickness is formed on the side wall of the trench 202. The trench 202 is filled with wolfram silicide 205. A p-base region 208 is formed in a part of the surface layer of the n-type well region 214 with a narrow space from the trench 202. An n-source region 209 is formed in a part of the surface layer of the p-base region 208. A poly-crystalline silicon gate electrode 207 is disposed, with a gate oxide film 206 of 20 to 50 nm in thickness inserted inbetween, above the portions of the p-base region 208 and the n-type well region 214 extending between the n-source region 209 and the side wall oxide film 204. A p-contact region 210, with a higher impurity dose than the p-base region 208, is formed in a part of the surface layer of the p-base region 208. A source electrode 212 is disposed in common contact with the p-contact region 210 and n-source region 209. A drain electrode 213 is disposed on the wolfram silicide 205. An inter-layer insulation film 211 is formed on the side and upper faces of the gate electrode 207 to insulate the gate electrode 207 from the source electrode 212 and the drain electrode 213. The device structure of FIG. 2 is the same with the device structure of the first embodiment except the provision of the n-type well region 214. Since the second embodiment device of FIG. 2 operates in the same way as the first embodiment device of FIG. 1, such duplicate explanation will be omitted.

In the first embodiment of FIG. 1, the current path is narrowed when the device is turned on, since the distance LA between the p-base region 108 and the side wall oxide film 104 is short, 1 to 2 $\mu$m.

In contrast, the second embodiment prevents the current path from being narrowed by forming the n-well region 214 to reduce the resistance of the surface layer between p-base region 208 and the side wall oxide film 204. Therefore, the second embodiment reduces the on-resistance more effectively than the first embodiment. Though FIG. 2 shows an example in that the n-well region 214 is shallower than the trench 202, no problems are caused by an n-well region 214 deeper than the trench 202.

Figure 3:
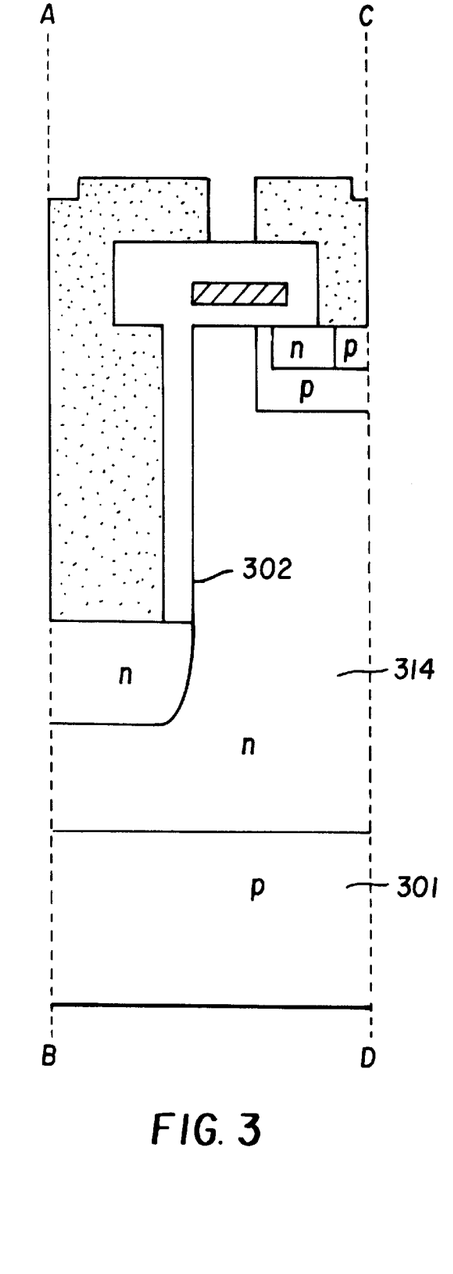
FIG. 3 is a cross section of a third embodiment of a lateral trench MOSFET according to the present invention.

FIG. 3 is a cross section of a third embodiment of a lateral trench MOSFET according to the present invention. In FIG. 3, a p-type semiconductor substrate 301 with specific resistivity of 10 to 50 $\Omega$·cm is used in place of the n-type substrate of FIGS. 1 and 2. After forming an n-well region 314, a trench 302 is formed in the surface layer of the n-well region 314. The surface impurity concentration of the n-well region 314 is the same as that of the n-well region 214 of the second embodiment. The diffusion depth of the n-well region 314 is set deeper than the depth of the trench 302 at 5 to 10 $\mu$m.

Since the structure of FIG. 3 facilitates forming the n-well region 314 selectively in the p-type substrate 301, control and protection circuits may be formed in the portion of the same p-type substrate 301 in which the trench MOSFET is not formed. The structure of FIG. 3 also facilitates integrating a plurality of power MOSFETs into a single chip.

Figure 4:
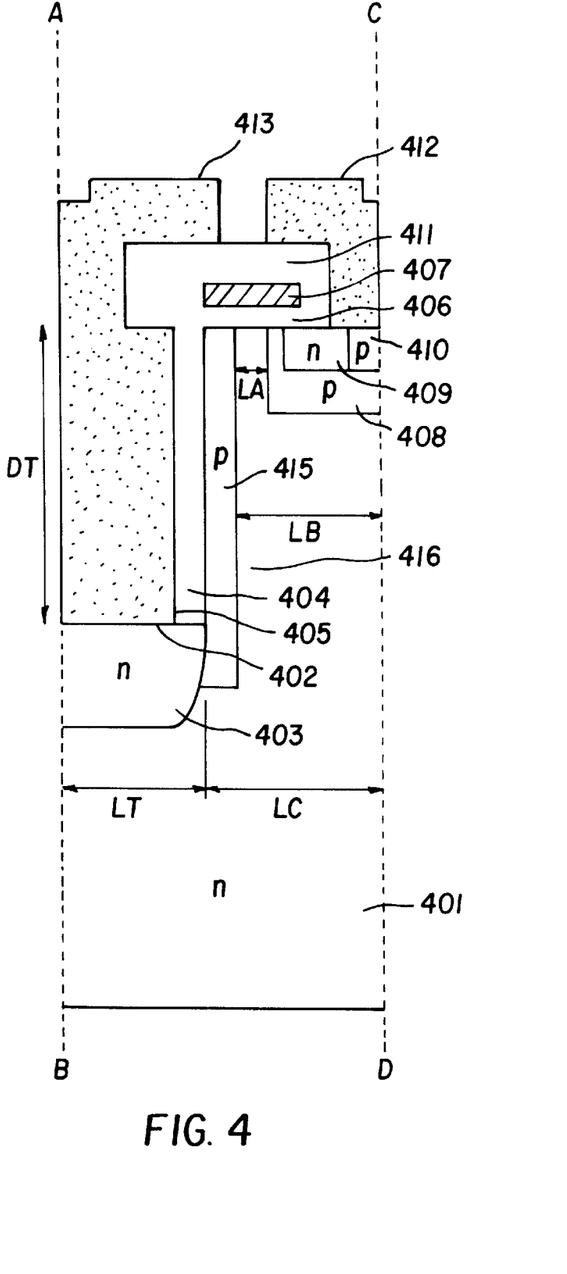
FIG. 4 is a cross section of a fourth embodiment of a lateral trench MOSFET according to the present invention.

FIG. 4 is a cross section of a fourth embodiment of a lateral trench MOSFET according to the present invention. The device of FIG. 4 has an n-type semiconductor substrate 401 with specific resistivity of 5 Ω·cm, in the surface layer thereof is dug a trench 402. An n-drain region 403 is formed in the bottom of the trench 402. The trench 402 is 2 $\mu$m in width (LT×2) and 3 $\mu$m in depth (DT). The surface concentration of the n-drain region 403 is $1 \times 10^{20}$ cm$^{-3}$ and its diffusion depth is 2 to 3 $\mu$m. A side wall oxide film 404 of 0.5 to 1 $\mu$m in thickness is formed on the side wall of the trench 402. A p-side wall region 415 is formed in the semiconductor layer along the side wall oxide film 404. The surface impurity concentration of the p-side wall region 415 is $1 \times 10^{17}$ cm$^{-3}$ and its diffusion depth is 1 $\mu$m. The trench 402 is filled with wolfram silicide 405. A p-base region 408 is formed in a part of the surface layer of the n-type semiconductor substrate 401 with a narrow space from the trench 402. An n-source region 409 is formed in a part of the surface layer of the p-base region 408. A poly-crystalline silicon gate electrode 407 is disposed, with a gate oxide film 406 of 20 to 50 nm in thickness inserted inbetween, above the portions of the p-base region 408, the n-type substrate 401 and the p-side wall region 415 extending between the n-source region 409 and the side wall oxide film 404. The p-base region 408 and the n-source region 409 are self-aligned by using the edge of the gate electrode 407 for masking. A p-contact region 410, with a higher impurity dose than the p-base region 408, is formed in a part of the surface layer of the p-base region 408. A source electrode 412 is disposed in common contact with the p-contact region 410 and n-source region 409. A drain electrode 413 is disposed on the wolfram silicide 405. An inter-layer insulation film 411 is formed on the side and upper faces of the gate electrode 407 to insulate the gate electrode 407 from the source electrode 412 and the drain electrode 413.

By applying a positive bias voltage to the gate electrode 407, an inversion layer is created in the surface layer of the p-base region 408, and electrons flow from the n-source region 409 to the substrate 401. Then, the electrons flow through a drain drift region 416 between the p-base region 408 and the p-side wall region 415 to then-drain region 403. Since the illustrated unit cell is arranged in mirror symmetry with respect to C–D of FIG. 4, the n-type semiconductor substrate 401 is extending between the p-side wall region 415 and the not-illustrated p-side wall region. The spacing between the adjoining p-side wall regions 415 and 415 is 2×LB. Due to this, if the specific resistivity of the n-type semiconductor substrate 401 were reduced to about a half of the specific resistivity of the n-type semiconductor substrate 101 of the first embodiment, the breakdown voltage of the device of FIG. 4 is not lowered. Therefore, the device of FIG. 4 facilitates improving the trade-off relation between the breakdown voltage and on-resistance thereof. The optimum dimensions of the device of FIG. 4 include 1 $\mu$m for LA, 2.5 $\mu$m for LB, and 3.5 $\mu$m for LC.

Figure 17A:
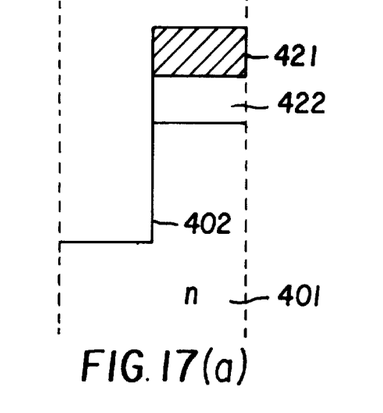
FIGS. 17 shows cross sections of a part of the device of FIG. 4 for explaining the process for manufacture thereof.
Figure 17B:
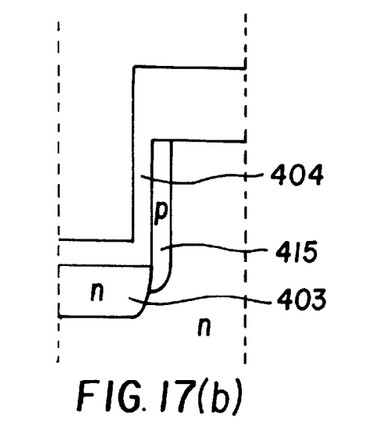
Figure 17C:
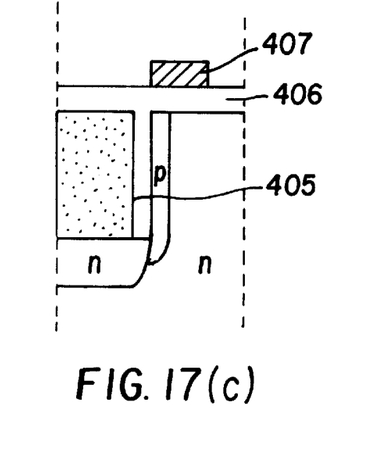

FIGS. 17(*a*)–(*c*) and 18(*a*)–(*c*) show cross sections of a part of the device of FIG. 4 for explaining the process for manufacture. The process for manufacture of the device of FIG. 4 will be explained below.

An oxide film 422 is formed on the n-type semiconductor substrate 401 with specific resistivity of 5 Ω·cm. Anisotropic etching is conducted selectively on the n-type semiconductor substrate 401 by using a photoresist film 421 for masking to form the trench 402 (FIG. 17(*a*)). The width of about 2 $\mu$m and the depth of about 3 $\mu$m of the trench 402 are appropriate for realizing the breakdown voltage of 100 V of the device. After removing the photoresist film 421, an oxide film of about 0.1 $\mu$m in thickness is formed by thermal oxidation on the bottom and side faces of the trench 402. Then, phosphorus ions are implanted. The phosphorus ions are doped only into the bottom of the trench 402, since the surface of the substrate 401 is covered with the thick oxide film 422 and since the phosphorus ion beam runs almost in parallel to the side wall of the trench 402. Then, boron ions are implanted into the side wall of the trench 402 by slanting the boron beam by 10 to 30 degrees. The implanted phosphorus and boron ions are diffused by heat treatment to form the n-drain region 403 and the p-side wall region 415. The surface concentration of the n-drain 403 is $1 \times 10^{20}$ cm$^{-3}$ and the diffusion depth thereof is 2 to 3 $\mu$m. And, the surface concentration of the p-side wall region 415 is $1 \times 10^{17}$ cm$^{-3}$ and the diffusion depth thereof is 1 $\mu$m.

Though the boron ions are implanted also into the bottom of the trench 402, the n-drain region 403 and the n-type substrate 401 are connected with one another, since the n-drain region 403 is diffused more deeply with a higher impurity dose. The side wall film 404 of the trench 402 is thickened to 0.5 to 1 $\mu$m by the heat treatment or by additional CVD (FIG. 17(*b*)). Then, after removing the oxide film from the bottom of the trench 402, the wolfram silicide 405 is buried in the trench 402. The surfaces of the wolfram silicide 405 and the semiconductor region are flattened to expose the surface of the semiconductor region in which the trench is not formed. Then, the gate oxide film 406 is formed by thermal oxidation to a thickness of 20 to 50 nm, and the poly-crystalline silicon gate electrode 407 is formed by low pressure CVD and subsequent photo-etching (FIG. 17(*c*)).

Figure 18A:
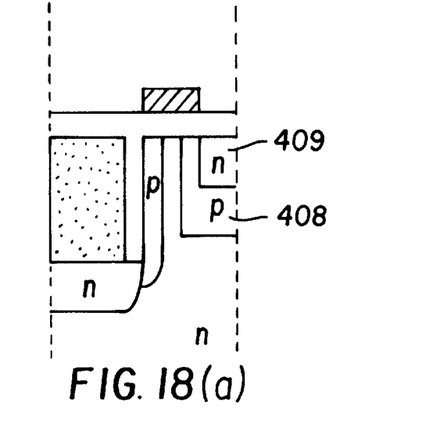
FIGS. 18 show cross sections of a part of the device of FIG. 4 for explaining the process for manufacture subsequent to the process of FIG. 17.
Figure 18B:
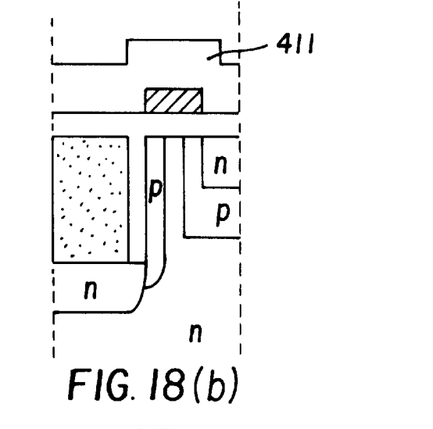
Figure 18C:
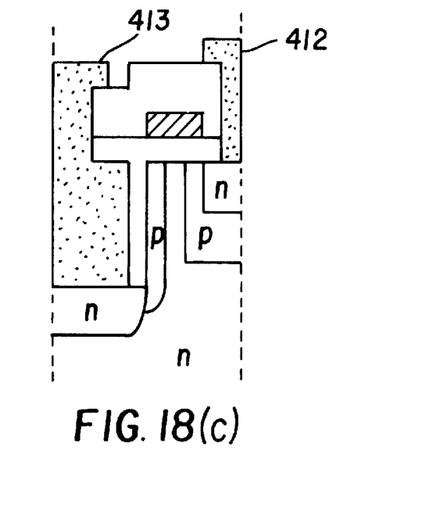

Then, the p-base region 408, the n-source region 409 and the p-contact region 410 not illustrated in FIG. 16 are formed by using the edge of the gate electrode 407 for masking (FIG. 18(*a*)). Then, the inter-layer insulation film 411 is deposited on the side and upper faces of the gate electrode 407 to insulate the gate electrode 107 from the other electrodes (FIG. 18(*b*)). And, contact holes are opened in the inter-layer insulation film 411 and the oxide film 406, and the source electrode 412 and the drain electrode 413 are formed (FIG. 18(*c*)). Finally, the passivation film is deposited on the device at the end of the wafer process.

Figure 5:
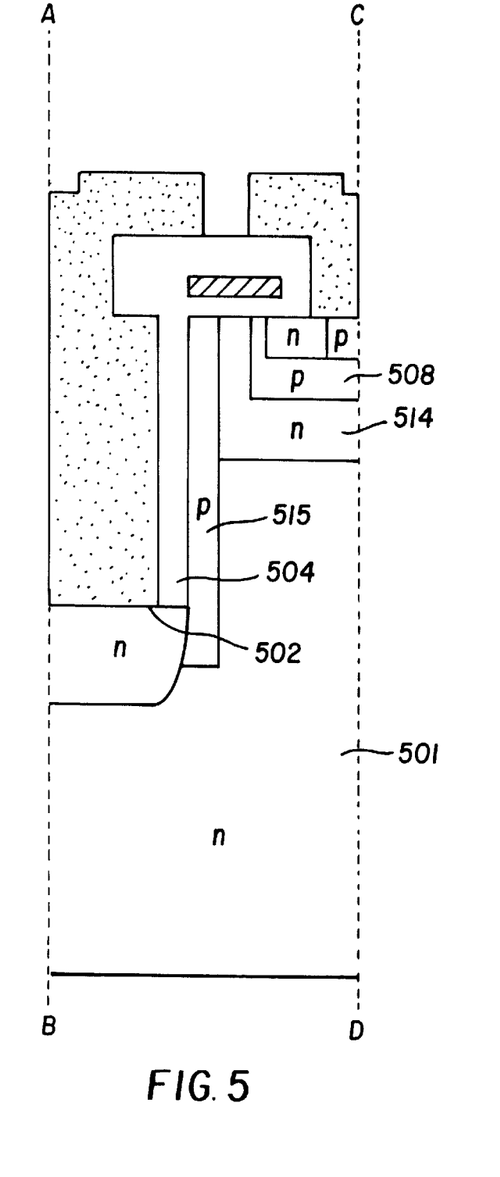
FIG. 5 is a cross section of a fifth embodiment of a lateral trench MOSFET according to the present invention.

FIG. 5 is a cross section of a fifth embodiment of a lateral trench MOSFET according to the present invention. The device of FIG. 5 is different from the device of FIG. 4 in that an n-well region 514 is formed from the surface layer of an n-type semiconductor substrate 501 with specific resistivity of 5 Ω·cm by phosphorus ion implantation and subsequent thermal diffusion. The other parts are formed similarly with those of the fourth embodiment. The surface concentration of the n-well region 514 is $3 \times 10^{16}$ cm$^{-3}$, and the diffusion depth of the n-well region 514 is 2 $\mu$m. A p-side wall region 515 is formed in the semiconductor layer along the side wall oxide film 504 of a trench 502. The surface impurity concentration of the p-side wall region 515 is $1 \times 10^{17}$ cm$^{-3}$ and its diffusion depth is 1 $\mu$m.

The fifth embodiment shows combined effects of the second and fourth embodiments. That is, the fifth embodiment prevents the current path from being narrowed by forming the n-well region 514 to reduce the resistance of the surface layer between a p-base region 508 and the p-side wall region 515. Therefore, the fifth embodiment facilitates further reducing the on-resistance. If the specific resistivity of the n-type semiconductor substrate 501 were reduced to about a half of the specific resistivity of the n-type semiconductor substrate 201 of the second embodiment, the breakdown voltage of the device of FIG. 5 is not lowered, since the p-side wall region 515 exists. Therefore, the device of FIG. 5 facilitates improving the trade-off relation between the breakdown voltage and on-resistance thereof. An n-well region 514 that is deeper than the trench 502 causes no problem.

Figure 6:
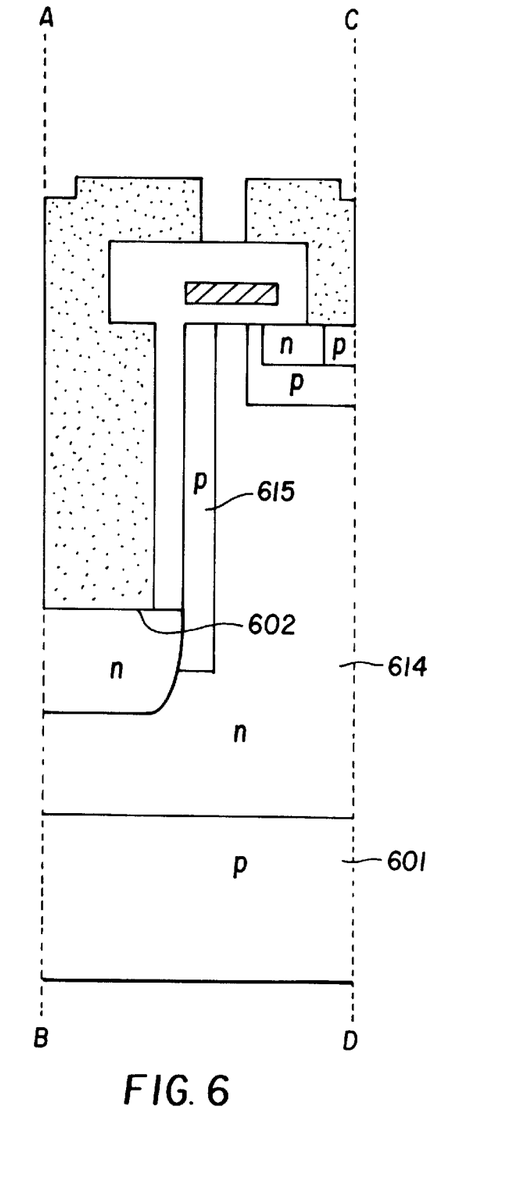
FIG. 6 is a cross section of a sixth embodiment of a lateral trench MOSFET according to the present invention.

FIG. 6 is a cross section of a sixth embodiment of a lateral trench MOSFET according to the present invention. The device of FIG. 6 is different from the fourth and fifth embodiments in that a p-type semiconductor substrate 601- with specific resistivity of 10 to 50 $\Omega \cdot$cm is used in place of the n-type substrates of FIGS. 4 and 5. After forming an n-well region 614, a trench 602 is formed in the surface layer of the n-well region 614. The diffusion depth of the n-well region 614 is set deeper than the depth of the trench 602 at 5 to 10 $\mu$m.

The sixth embodiment shows combined effects of the third and fourth embodiments. That is, since the structure of FIG. 6 facilitates forming the n-well region 614 selectively in the p-type substrate 601, control and protection circuits may be formed in the portion of the same p-type substrate 601 in which the trench MOSFET is not formed. The structure of FIG. 6 also facilitates integrating a plurality of power MOSFETs into a single chip. If the specific resistivity of the n-well region 614 were reduced to about a half of the specific resistivity of the n-well region 501 of the fifth embodiment, the breakdown voltage of the device of FIG. 6 is not lowered, since the p-side wall 615 exists. Therefore, the device of FIG. 6 also facilitates improving the trade-off relation between the breakdown voltage and on-resistance thereof.

Figure 7:
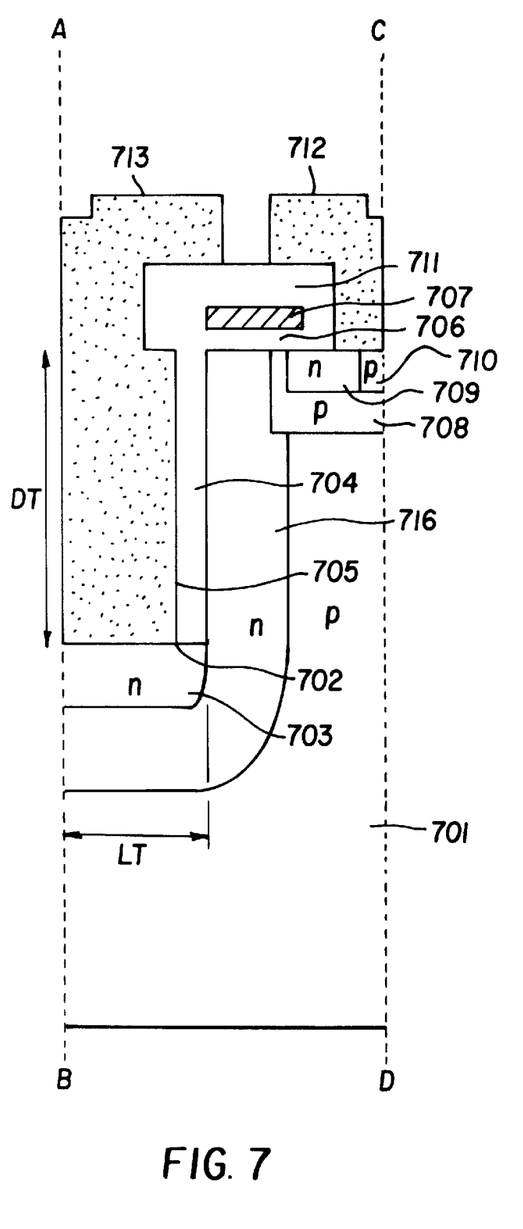
FIG. 7 is a cross section of a seventh embodiment of a lateral trench MOSFET according to the present invention.

FIG. 7 is a cross section of a seventh embodiment of a lateral trench MOSFET according to the present invention. In the seventh embodiment an n-channel lateral MOSFET is formed not in an n-type semiconductor layer but in a p-type semiconductor layer. A trench 702 is dug in the surface layer of a p-type semiconductor substrate 701 with specific resistivity of 5 $\Omega \cdot$cm. An n-drain drift region 716 is formed in the bottom and side faces of the trench 702. And, an n-drain region 703, with a higher impurity dose than the n-drain drift region 716, is formed in the bottom of the trench 702. The surface concentration of the n-drain drift region 716 is $1 \times 10^{17}$ cm$^{-3}$, and the diffusion depth thereof is 1 $\mu$m. The surface concentration of the n-drain region 703 is $1 \times 10^{20}$ cm$^{-3}$, and the diffusion depth thereof is 1 to 3 $\mu$m. The width (2×LT of the figure) of the trench 702 is 2 $\mu$m and the depth (DT) thereof is 3 $\mu$m. A side oxide film 704 of 0.5 to 1 $\mu$m in thickness is formed on the side wall of the trench 702. The trench 702 is filled with wolfram silicide 705. A p-base region 708 is formed in a part of the surface layer of the p-type substrate 701 a narrow space from the trench 702. An n-source region 709 is formed in a part of the surface layer of the p-base region 708. A poly-crystalline silicon gate electrode 707 is disposed, with a gate oxide film 706 of 20 to 50 nm in thickness inserted inbetween, above the portions of the p-base region 708 and the n-drain drift region 716 extending between the n-source region 709 and the trench 702. The p-base region 708 and the n-source region 709 are self-aligned by using the edge of the gate electrode 707 for masking. A p-contact region 710, with a higher impurity dose than the p-base region 708, is formed in a part of the surface layer of the p-base region 708. A source electrode 712 is disposed in common contact with the p-contact region 710 and n-source region 709. A drain electrode 713 is disposed on the wolfram silicide 705. An inter-layer insulation film 711 is formed on the side and upper faces of the gate electrode 707 to insulate the gate electrode 707 from the source electrode 712 and the drain electrode 713. The device structure of FIG. 7 facilitates, by optimizing the impurity concentrations of the p-type substrate 701 and the n-drain drift region 716, expansion of a depletion layer and relaxation of an electric field even when the n-drain drift region 716 is doped relatively heavily. Therefore, the device of FIG. 7 facilitates reducing the on-resistance thereof while maintaining the breakdown voltage thereof. Control and protection circuits may be formed in the same p-type substrate.

Figure 8:
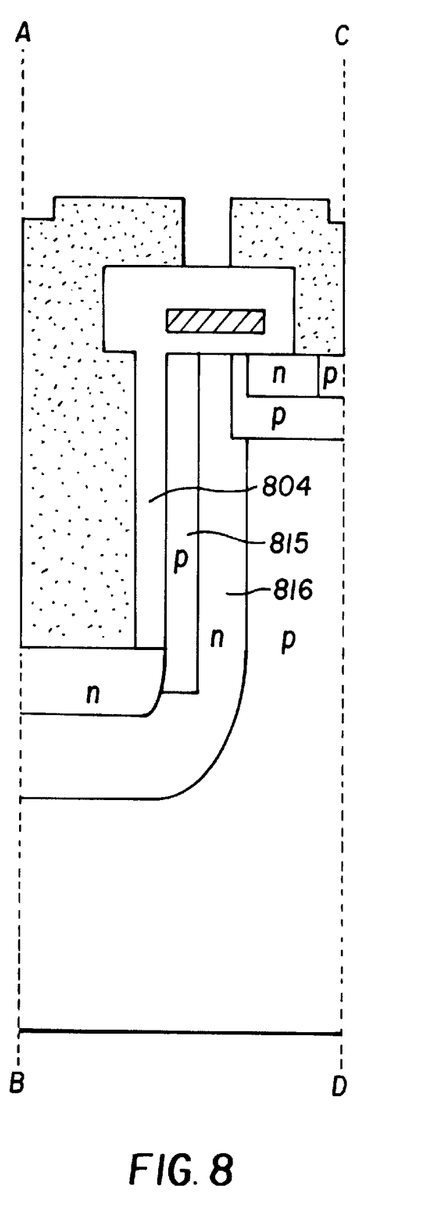
FIG. 8 is a cross section of an eighth embodiment of a lateral trench MOSFET according to the present invention.

FIG. 8 is a cross section of an eighth embodiment of a lateral trench MOSFET according to the present invention. The device of FIG. 8 is a modification of the embodiment of FIG. 7. In FIG. 8, a p-side wall region 815 is formed in an n-drain drift region 816 along a side wall oxide film 804. By this structure, since the n-drain drift region 816 sandwiched between the p-side wall region 815 and the p-type substrate 801 is easily depleted, the impurity concentration in the n-drain drift region 816 can be further increased. Therefore, the device of FIG. 8 facilitates further reducing the drain resistance thereof while maintaining the breakdown voltage thereof.

Figure 9:
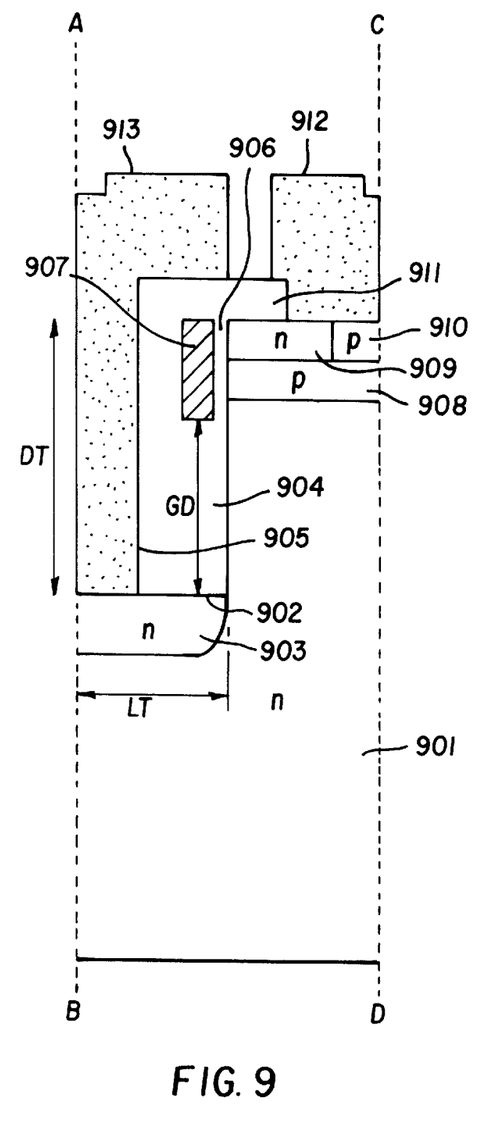
FIG. 9 is a cross section of a ninth embodiment of a lateral trench MOSFET according to the present invention.

FIG. 9 is a cross section of a ninth embodiment of a lateral trench MOSFET according to the present invention. Referring now to FIG. 9, a trench 902 is dug in the surface layer of the n-type substrate 901 with specific resistivity of 5 $\Omega \cdot$cm. The trench 902 is 2 $\mu$m in width (LT×2) and 3 $\mu$m in depth (DT). An n-drain region 903 is formed in the bottom of the trench 902. A p-base region 908 is formed on the portion of the substrate 901 in which the trench 902 is not formed. An n-source region 909 is formed in the surface layer of the p-base region 908. The surface concentration is $1 \times 10^{18}$ cm$^{-3}$ for the p-base region 908, $1 \times 10^{20}$ cm$^{-3}$ for the n-source region 909 and $1 \times 10^{20}$ cm$^{-3}$ for the n-drain region 903. The diffusion depth is about 1 $\mu$m for the p-base region 908, 0.5 $\mu$m for the n-source region 909 and 0.5 $\mu$m for the n-drain region 903. A poly-crystalline silicon gate electrode 907 is disposed, with a gate oxide film 906 of 50 $\mu$m inserted inbetween, opposed facing to the portion of the p-base region 908 exposed to the trench 902. The other parts of the side wall of t' trench 902 are covered with a thick side wall oxide film 904 of 0.5 to 1 $\mu$m in thickness. The trench 902 is filled with wolfram silicide 905. A p-contact region 910, with a higher impurity dose than the p-base region 908, is formed in a part of the surface layer of the p-base region 908. A source electrode 912 is disposed in common contact with the p-contact region 910 and n-source region 909. A drain electrode 913 is disposed on the wolfram silicide 905. An inter-layer insulation film 911 is deposited on the side and upper faces of the gate electrode 907 to insulate the gate electrode 907 from the source electrode 912 and the drain electrode 913. The distance GD between the gate electrode 907 and the n-drain region 903, i.e. the important parameter that determines the breakdown voltage of the device, is 2 $\mu$m, long enough to obtain a breakdown voltage of 100 V. The lateral trench MOSFET of FIG. 10 facilitates reducing the on-resistance thereof, since the areas of the n-source region 909 and the source electrode 912 are widened by burying the gate electrode 907 in the trench 902.

Figure 10:
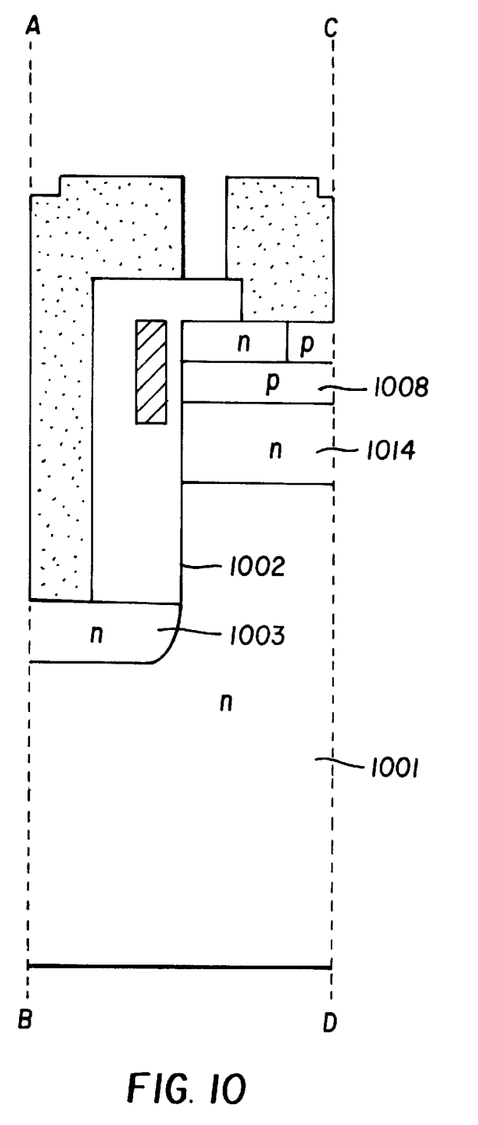
FIG. 10 is a cross section of a tenth embodiment of a lateral trench MOSFET according to the present invention.

FIG. 10 is a cross section of a tenth embodiment of a lateral trench MOSFET according to the present invention. The device of FIG. 10 is different from the ninth embodiment shown in FIG. 9 in that an n-well region 1014 is formed from the surface layer of an n-type semiconductor substrate 1001 with specific resistivity of 5 Ω·cm by phosphorus ion implantation and subsequent thermal diffusion. The surface concentration of the n-well region 1014 is $3 \times 10^{16}$ cm$^{-3}$, and the diffusion depth of the n-well region 1014 is 2 μm. The tenth embodiment prevents the current path from being narrowed by forming the n-well region 1014 to reduce the resistance of the surface layer between a p-base region 1008 and a p-side wall oxide film 1004. Therefore, the tenth embodiment facilitates reducing the on-resistance more than the ninth embodiment. Though FIG. 10 shows an example in that the n-well region 1014 is more shallow than the trench 1002, no problems are caused by an n-well region 1014 deeper than the trench 1002.

Figure 11:
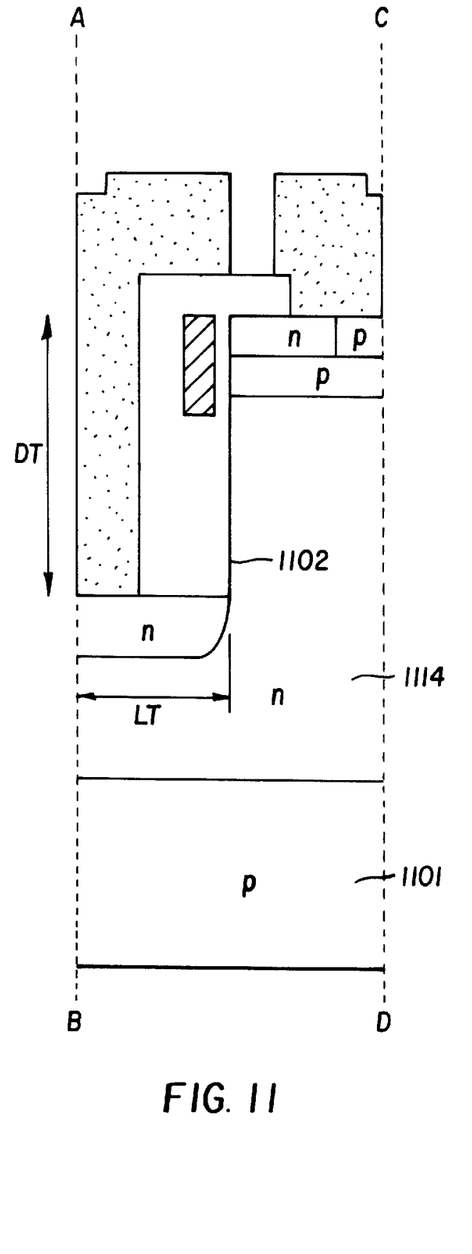
FIG. 11 is a cross section of a eleventh embodiment of a lateral trench MOSFET according to the present invention.

FIG. 11 is a cross section of a eleventh embodiment of a lateral trench MOSFET according to the present invention. The device of FIG. 11 is different from the ninth embodiment shown in FIG. 9 in that a p-type semiconductor substrate 1101 with specific resistivity of 10 to 50 Ω·cm is used in place of the n-type substrate of the ninth embodiment. After forming an n-well region 1114, a trench 1102, 2 μm in width (LT×2) and 3 μm in depth (DT), is formed in the surface layer of the p-type substrate 1101. Though the surface concentration of the n-well region 1114 is set to be the same with that of the n-well region 1014 of the tenth embodiment, the diffusion depth of the n-well region 1114 is set deeper than the depth of the trench 1102 at 5 to 10 μm. Since the structure of FIG. 11 facilitates forming the n-well region 1114 selectively in the p-type substrate 1101, control and protection circuits may be formed in the portion of the same p-type substrate 1101 in which the trench MOSFET is not formed. The structure of FIG. 11 also facilitates integrating a plurality of power MOSFETs into a single chip.

Figure 12:
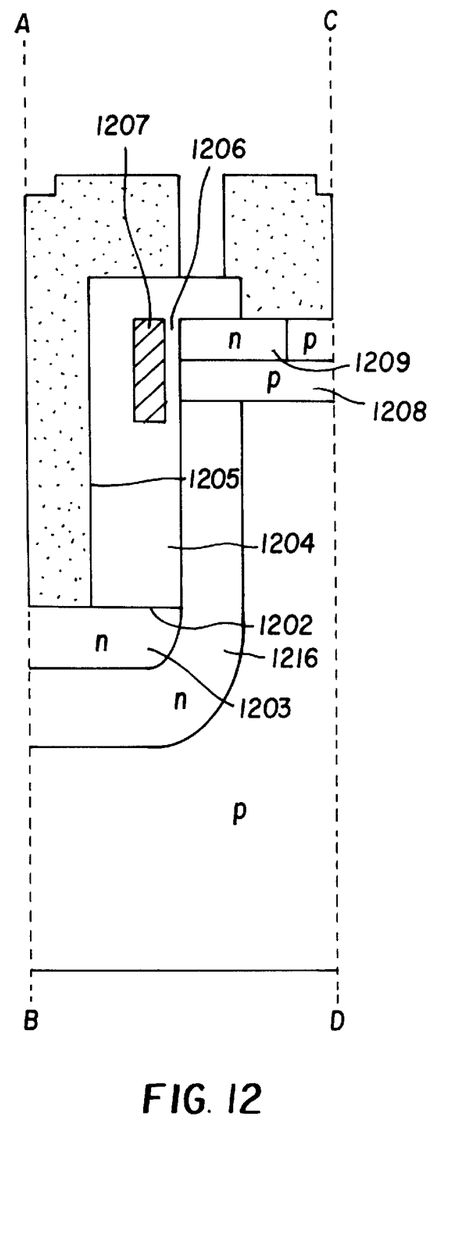
FIG. 12 is a cross section of a twelfth embodiment of a lateral trench MOSFET according to the present invention.

FIG. 12 is a cross section of a twelfth embodiment of a lateral trench MOSFET according to the present invention. The device of FIG. 12 is a modification of the seventh embodiment shown in FIG. 7. In FIG. 12, similarly as in FIG. 7, an n-drain drift region 1216 is formed beside a trench 1202, in the bottom thereof is formed an n-drain region 1203 with a higher impurity dose than the n-drain drift region 1216. The twelfth embodiment is different from the seventh embodiment in that a p-base region 1208 and an n-source region 1209 reach the inner face of the trench 1202. And, a poly-crystalline silicon gate electrode 1207 is disposed, with a gate oxide film of 50 nm in thickness inserted inbetween, opposed facing to the portion of the p-base region 1208 exposed to the trench 1202. The other parts of the side wall of the trench 1202 are covered with a thick side wall oxide film 1204 of 0.5 to 1 μm in thickness. The trench 1202 is filled with wolfram silicide 1205.

The structure of FIG. 12 has the n-drain drift region 1216 formed in the bottom and side faces of the trench 1202 in place of the n-well region 1114 of the eleventh embodiment. By optimizing the impurity concentrations of the p-type substrate 1201 and the n-drain drift region 1216, expansion of a depletion layer and relaxation of an electric field are facilitated. Therefore, the device of FIG. 12 facilitates reducing the drain resistance thereof while maintaining the breakdown voltage thereof. The lateral trench MOSFET of FIG. 12 facilitates reducing the on-resistance thereof, since the areas of the n-source region 1209 and the source electrode 1212 are widened by burying the gate electrode 1207 in the trench 1202. And, control and protection circuits may be formed in the portion of the same p-type substrate 1201 in which the lateral trench MOSFET is not formed.

In the embodiments described above, the drain electrode may be disposed in direct contact with the n-drain region located in the bottom of the trench. However, a structure that facilitates manufacturing the device is obtained by filling the trench with conductive material such as wolfram silicide etc. and by disposing the drain electrode on the conductive material, since the unevenness of the electrode is prevented from occurring. Wolfram silicide has been chosen as a conductive material that exhibits low specific resistivity and that can fill a narrow trench. Another candidate conductive material may be poly-crystalline silicon.

In the embodiments described above, the conductivity types of the semiconductor regions may be interchanged one another. And, since the gate insulation film is not always limited to an oxide film, the present invention is applicable also to the MISFETs which have a MIS gate structure.

The lateral trench MISFET of the present invention shows following effects.

The lateral trench MISFET of the invention comprises:
a semiconductor layer of the first conductivity type; a trench formed in the semiconductor layer; a drain region of the first conductivity type formed in the bottom of the trench; a base region of the second conductivity type and a source region of the first conductivity type formed on the portion of the semiconductor layer in which the trench is not formed; a MIS gate structure formed on the base region; and a drain drift region disposed along the side wall of the trench. By the adoption of the above described structure, the lateral trench MISFET of the invention improves the breakdown voltage thereof, facilitates integrating many unit cells to reduce the on-resistance thereof, and improves the trade-off relation between the breakdown voltage and the on-resistance.

By forming the MIS gate structure on the portion of the semiconductor layer of the first conductivity type in which the trench is not formed, the uniformity and reliability of the gate insulation film are improved.

By forming a well region of the first conductivity type, with a higher impurity dose than the semiconductor layer of the first conductivity type, on the semiconductor layer, the current path is prevented from being narrowed and the on-resistance is reduced.

By forming a side wall region on the semiconductor layer of the first conductivity type along the side wall oxide film of the trench, it is facilitated to reduce the specific resistivity of the semiconductor layer of the first conductivity type functioning as a drain drift region and to improve the trade-off relation between the breakdown voltage and the on-resistance.

By forming the semiconductor layer of the first conductivity type on the semiconductor substrate of the second conductivity type and by forming a lateral trench MISFET structure in the semiconductor layer, it is facilitated to integrate control and protection circuits or a plurality of MISFET into a single chip.

By forming the trench in the semiconductor substrate of the first conductivity type, a drain drift region of the second conductivity type beside the trench and a drain region of the second conductivity type in the bottom of the trench, it is facilitated to increase the impurity concentration of the drain drift region of the second conductivity type, to relax the electric field and to reduce the on-resistance.

By extending the gate electrode above the edge of the trench as well as to the base region, the electric potential distribution is equalized by the field plate function of the extended gate electrode and it is facilitated to provide the device with a higher breakdown voltage.

By exposing the base region of the second conductivity type and the source region of the first conductivity type to the trench and by disposing the gate electrode opposed facing to the exposed portion of the base region with a gate oxide film inserted inbetween, it is facilitated to bury the gate electrode in the trench and to effectively use the upper surface of the portion in which the trench is not formed. This configuration facilitates integrating more unit cells and reducing the on-resistance.

By forming the drain electrode on the conductive material filling the trench, unevenness of the electrode is avoided and the device is easy to manufacture.

By combining the effective structures described above, a lateral trench MISFET is obtained that facilitates integrating many more devices, reducing on-resistance thereof, and improving the trade-off relation between the breakdown voltage and the on-resistance.

What is claimed is:

1. A method of manufacturing a lateral trench MISFET, comprising the steps of:

providing a semiconductor layer of a first conductivity type;

forming a trench in a surface layer of the semiconductor layer by etching utilizing a mask;

forming a drain region of the first conductivity type in a bottom of said trench by ion implantation and subsequent diffusion;

burying a conductive material in said trench;

flattening surfaces of said semiconductor layer and said conductive material, thereby exposing a surface of a portion of said semiconductor layer separate from the trench;

forming a gate insulation film on the surface of the portion of the semiconductor layer separate from the trench;

forming a gate electrode on said gate insulation film;

forming a base region of the second conductivity type and a source region of the first conductivity type in said semiconductor layer, by utilizing said gate electrode as a mask for self-alignment;

forming an inter-layer insulation film on said gate electrode;

opening contact holes in said inter-layer insulation film; and disposing drain and source electrodes in said contact holes.

2. The method of claim 1, further comprising the step of forming a side wall region of the second conductivity type in a side face of said trench by oblique ion implantation at an oblique angle to said side face, and by subsequent diffusion.

* * * * *